United States Patent
Hoover

(10) Patent No.: US 7,323,950 B2
(45) Date of Patent: Jan. 29, 2008

(54) BALANCED HYBRID COUPLER NETWORK

(76) Inventor: Lowell R. Hoover, 4601 Shelburne Dr., Bloomington, IN (US) 47404

( * ) Notice: Subject to any disclaimer, the term of this patent is extended or adjusted under 35 U.S.C. 154(b) by 565 days.

(21) Appl. No.: 10/916,944

(22) Filed: Aug. 12, 2004

(65) Prior Publication Data

US 2006/0035615 A1 Feb. 16, 2006

(51) Int. Cl.
*H01P 5/12* (2006.01)
*H01P 5/22* (2006.01)

(52) U.S. Cl. ........................................ 333/117; 333/118
(58) Field of Classification Search ................ 333/117, 333/118, 120, 121, 122; 332/103, 105
See application file for complete search history.

(56) References Cited

U.S. PATENT DOCUMENTS

| | | | |
|---|---|---|---|
| 5,122,765 A * | 6/1992 | Pataut | 332/105 |
| 5,313,174 A | 5/1994 | Edwards | 333/109 |
| 6,343,211 B1 * | 1/2002 | Thodesen et al. | 455/317 |
| 6,445,346 B2 | 9/2002 | Fathy et al. | 343/700 MS |

OTHER PUBLICATIONS

"Complex Modulators and Demodulators", Mar. 21, 1996.
"SMT Quadrifilar Feed Network" VER Jan. 11, 2002.

* cited by examiner

*Primary Examiner*—Dean Takaoka
(74) *Attorney, Agent, or Firm*—Taylor & Aust, P.C.

(57) ABSTRACT

An electrical processing network including a first set of ports and a second set of ports electrically coupled to the first set of ports. The first set of ports are for a first set of signals with approximately 0° and 180° relative phase. The second set of ports are for a second set of signals with approximately 0°, 90°, 180° and 270° relative phase.

17 Claims, 3 Drawing Sheets

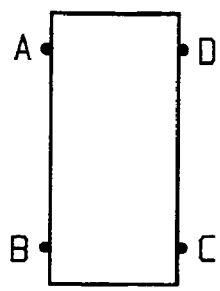
Fig. 1A
|  | OUTPUT PORT | | | |
|---|---|---|---|---|
| INPUT PORT | | A | B | C | D |
| | A | | ISO. | 0° | 90° |
| | B | ISO. | | 90° | 0° |
| | C | 0° | 90° | | ISO. |
| | D | 90° | 0° | ISO. | |
Fig. 1B
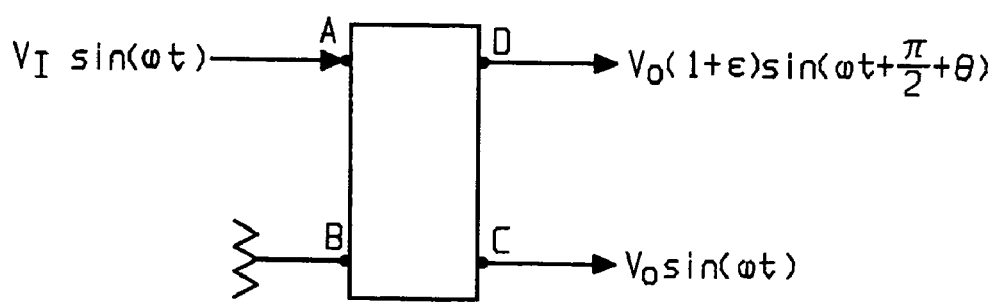
Fig. 2

BALANCED HYBRID COUPLER NETWORK

BACKGROUND OF THE INVENTION

1. Field of the Invention

The present invention relates to electrical networks, and, more particularly, to an electrical coupler network.

2. Description of the Related Art

Electrical signals can be divided and/or combined for a variety of purposes. For example, the signal power output requirements for a radio frequency (RF) system may exceed the capability of readily available RF amplifiers. To produce the required power output, the RF signal is divided and inputted to multiple amplifiers. The individual amplifier outputs are then combined to provide a power output which none of the amplifiers can produce individually.

A hybrid coupler is used for generating or combining near equal amplitude signals, having a predetermined relative phase, in the communications and related fields such as radar, navigation, etc. Hybrid couplers are used in many RF circuits and systems. The hybrid coupler is also known in the literature as the 3 dB hybrid. A hybrid coupler differs from a directional coupler, for example, in that the hybrid coupler can split an input signal into two nearly equal amplitude signals whereas the directional coupler splits the input signal into two unequal amplitude outputs.

The hybrid coupler is a four port device that can function both as a power splitter and as a power combiner. Two ports function as inputs and the other two ports function as outputs. When used as a power splitter, one of the input ports (commonly named the isolated port) is terminated in a resistance matched to the system's characteristic impedance ($Z_0$, typically 50 ohms for RF signals). FIG. 1A illustrates a schematic symbol for a hybrid coupler and FIG. 1B illustrates a corresponding phase truth table for the hybrid coupler. Referring to FIG. 1B, for a signal input at port A, for example, port B is the isolated port terminated with characteristic impedance $Z_0$, port C outputs a signal with an approximately 0° relative phase with respect to the signal input at port A, and port D outputs a signal with an approximately 90° relative phase with respect to the signal input at port A. FIG. 1B therefore illustrates what is sometimes referred to as a 90° hybrid.

Unfortunately, real hybrid couplers have non-ideal amplitude and phase responses that vary with operating frequency. Amplitude imbalance is defined as the difference between the hybrid coupler's two output signal amplitudes when operated as a splitter. Phase error is defined as the relative phase deviation from 90° between the hybrid coupler's two output signals when operated as a splitter. FIG. 2 shows a model of a real hybrid coupler functioning as a power splitter. In FIG. 2:

$V_I$=input signal amplitude (volts)
$V_O$=output signal amplitude (volts)
ω=signal angular frequency (radians per second)
t=time (seconds)
ϵ=amplitude imbalance
θ=phase error (radians)

Although approximately one-half of the power is delivered to each output, the two outputs do not have identical amplitudes as indicated by the (1+ϵ) term in FIG. 2. The phase error is indicated by the θ term of FIG. 2. Further, the amplitude response and the phase error of the coupler vary according to the frequency of the input.

Amplitude imbalance and phase error typically limit the useable frequency bandwidth of hybrid couplers to about one octave (2:1 frequency bandwidth, ratio of highest to lowest frequencies). Both amplitude imbalance and phase error are a function of frequency. A typical hybrid coupler can have amplitude imbalance as great as ±1 dB and phase error as great as a few degrees over a 2:1 frequency bandwidth.

For example, a typical hybrid coupler can have a 90° output with an amplitude output of −2.6 dB located at the center frequency of the input, and the 0° output can have a amplitude output of −3.4 dB at the center frequency, both in contrast to an ideal output of −3.0 dB. When one coupler drives two other couplers to create a four-way power divider, the imbalance at the four outputs of the two driven couplers is typically ±0.8 dB. One output is typically at −5.2 dB and the other output is at −6.8 dB, both in contrast to an ideal −6.0 dB. If these divided signals were sent to four amplifiers for amplification, one of the amplifiers would be presented a signal at approximately −5.2 dB, that is approximately 30% of the input signal power, rather than the desired 25%. As identical amplifiers are often used, each amplifier is required to be sized to handle 30% of the input signal value. This requirement limits amplifier selection, requires greater amplifier capacity, and reduces reliability due to one amplifier is amplifying an excess signal that should, ideally, be shared among four amplifiers.

Adding a fourth coupler can solve some of the amplitude imbalance problems; unfortunately, phase errors are associated with this type of solution. These phase errors contribute to amplitude errors which are significant enough to negate the amplitude enhancement when the four amplified signals are recombined.

The bandwidth limitation described above for the hybrid coupler can be the principal bandwidth limiter for a circuit in which the hybrid coupler is used. Additionally, such a network is susceptible to electromagnetic interference (EMI) and common mode noise. Electromagnetic noise coupled into the input can produce a common mode noise signal on the outputs thereby reducing the signal to noise ratio (S/N) of the circuit.

U.S. Pat. No. 5,313,174 (Edwards) discloses a 2:1 bandwidth RF splitter/combiner, that when used as a splitter, produces four signals. The Edwards '174 splitter/combiner improves some of the amplitude imbalance and phase errors present in the constituent hybrid couplers. Unfortunately, the Edwards splitter/combiner does not produce four signals sequentially offset by 90° and therefore is not a balanced circuit. The Edwards '174 splitter/combiner produces four signals with 180°, −180°, 90°, and −90°. However, this represents only three distinct electrical phases (180°, 90°, and −90°), since a signal with −180° electrical phase cannot be distinguished from a signal with 180° electrical phase. Further, the Edwards '174 splitter/combiner has only a single input port when operated as a splitter, it therefore cannot reject common-mode signals and is more susceptible to EMI. Yet further, the Edwards '174 splitter/combiner has only a 2:1 frequency bandwidth which is no better than the constituent hybrid couplers that make up the circuit.

U.S. Pat. No. 6,445,346 (Fathy et al.) discloses a polarizer feed network for a dual circular polarized antenna array. However, the Fathy et al. '346 network does not cancel the amplitude imbalance and phase error present in its two branch line couplers. Further, the Fathy et al. '346 does not have an extended frequency bandwidth beyond that of its constituent branch line couplers.

What is needed in the art is a network that cancels out the amplitude and phase errors inherent with hybrid couplers and thereby produces or combines equal-amplitude quadrature-phase signals with greater accuracy. Further, what is needed is to increase the frequency bandwidth over which equal-amplitude quadrature-phase signals can be generated or combined. Yet further, what is needed is a hybrid coupler network that is electrically balanced with respect to ground, and which can reciprocally operate.

SUMMARY OF THE INVENTION

The present invention provides a balanced hybrid coupler network with reduced amplitude and phase errors, and increased bandwidth.

The invention comprises, in one form thereof, an electrical processing network including a first set of ports and a second set of ports electrically coupled to the first set of ports. The first set of ports are for a first set of signals with approximately 0° and 180° relative phase. The second set of ports for a second set of signals with approximately 0°, 90°, 180° and 270° relative phase.

In another embodiment, the invention comprises an electrical system including an I/Q network having at least one mixer and an electrical processing network electrically coupled to the at least one mixer. The electrical processing network includes a first set of ports and a second set of ports electrically coupled to the first set of ports. The first set of ports are for a first set of signals with approximately 0° and 180° relative phase. The second set of ports for a second set of signals with approximately 0°, 90°, 180° and 270° relative phase.

An advantage of the present invention is a balanced hybrid coupler network with reduced amplitude and phase errors.

Another advantage of the present invention is that it effectively cancels amplitude errors associated with component hybrid couplers.

Yet another advantage of the present invention is that it effectively cancels phase errors associated with component hybrid couplers.

Yet another advantage of the present invention is improved bandwidth performance.

Yet another advantage of the present invention is that it produces or combines equal-amplitude quadrature-phase signals.

Yet another advantage of the present invention is that it produces or combines equal-amplitude quadrature-phase signals with great accuracy.

Yet another advantage of the present invention is a network that is electrically balanced with respect to ground.

Yet another advantage of the present invention is a network with lower susceptibility to electromagnetic interference.

Yet another advantage of the present invention is that it can reject common mode signals.

Yet another advantage of the present invention is lossless combining and splitting of signals.

Yet another advantage of the present invention is that it does not require tapered couplers although tapered couplers can be used.

Yet another advantage of the present invention is that it provides improved LO (local oscillator) to RF isolation.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein:

FIG. 1A is a schematic block diagram of a hybrid coupler;

FIG. 1B is an ideal truth table for the hybrid coupler of FIG. 1A;

FIG. 2 is a schematic block diagram of a real hybrid coupler showing the signal relationships between the various coupler ports, including amplitude and phase errors;

Corresponding reference characters indicate corresponding parts throughout the several views. The exemplifications set out herein illustrate one preferred embodiment of the invention, in one form, and such exemplifications are not to be construed as limiting the scope of the invention in any manner.

DETAILED DESCRIPTION OF THE INVENTION

Figure 3:
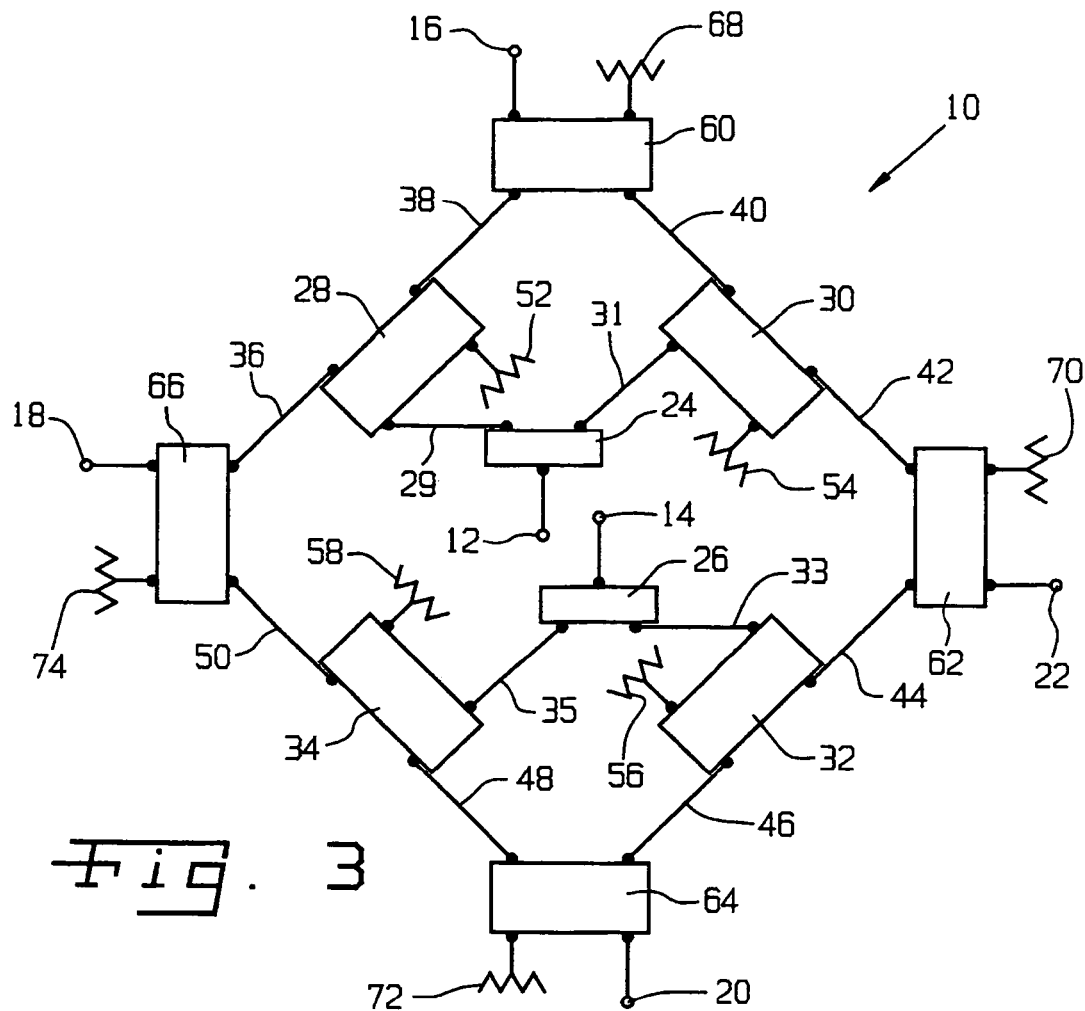
FIG. 3 is a schematic view of the balanced hybrid coupler network of the present invention.

Referring now to the drawings, and more particularly to FIG. 3, there is shown an electrical processing network 10, which in the embodiment shown is a balanced hybrid coupler network, which generally includes a first set of ports 12, 14 and a second set of ports 16, 18, 20 and 22 electrically coupled to the first set of ports 12, 14.

When operated as a splitter, balanced hybrid coupler network 10 is driven with two signals having nominally equal amplitudes and 180° relative phase at ports 12 and 14. For example, a signal at port 12 has a 0° relative phase and a signal at port 14 has a 180° relative phase. Both of these input signals are then split with respective two-way in-phase power splitters 24, 26. The resulting four signals have nominally equal amplitudes and a 0°, 0° and 180°, 180° phase relationship output from respective power dividers 24 and 26. These four signals are each input to respective hybrid couplers 28, 30, 32 and 34 via connections 29, 31, 33 and 35 respectively. Hybrid couplers 28, 30, 32 and 34 operate as power splitters and generate eight signals at connections 36, 38, 40, 42, 44, 46, 48 and 50. The isolated ports of hybrid couplers 28, 30, 32 and 34 are terminated in characteristic impedance terminations 52, 54, 56 and 58, respectively. The eight signals at connections 36, 38, 40, 42, 44, 46, 48 and 50 are subsequently combined in pairs 38, 40; 42, 44; 46, 48; and 36, 50 using hybrid couplers 60, 62, 64 and 66, respectively, which operate as power combiners. Hybrid couplers 60, 62, 64 and 66 also have their isolated ports terminated in characteristic impedance terminations 68, 70, 72 and 74, respectively. The signals at four ports 22, 16, 18 and 20 nominally have equal amplitudes and a 0°, 90°, 180° and 270° relative phase, respectively, providing four signals in true phase quadrature, or in other words, equal-amplitude phase-quadrature signals. In the mode described above, balanced hybrid coupler network 10 is operated as a quadrature-phase power splitter.

Since balanced hybrid coupler network 10 is a reciprocal network, it can operate in the reverse manner as a quadrature-phase power combiner. When operated as a combiner, ports 22, 16, 18 and 20 are driven with nominally equal-amplitude signals having a 0°, 90°, 180° and 270° relative phase, respectively. These four input signals are each input to respective hybrid couplers 62, 60, 66, and 64, that operate as power splitters. As described above, hybrid couplers 62, 60, 66, and 64 have their corresponding isolated ports terminated with a characteristic impedance. The eight signals produced by the power division at connections 36, 38, 40, 42, 44, 46, 48 and 50 are subsequently combined in pairs 36, 38; 40, 42; 44, 46; and 48, 50 using hybrid couplers 28, 30, 32 and 34, respectively operating as power combiners. As described above, hybrid couplers 28, 30, 32 and 34 have their corresponding isolated ports terminated with a characteristic impedance. The resulting four signals at connections 29, 31, 33 and 35 have nominally equal amplitudes and a 0°, 0°, 180°, 180° phase relationship, respectively. These four signals are combined in pairs 29, 31; 33, 35 with respective two-way in-phase power combiners 24, 26. The two resulting signals at ports 12 and 14 and have nominally equal-amplitudes and 0°, 180° relative phase, respectively.

Figure 4:
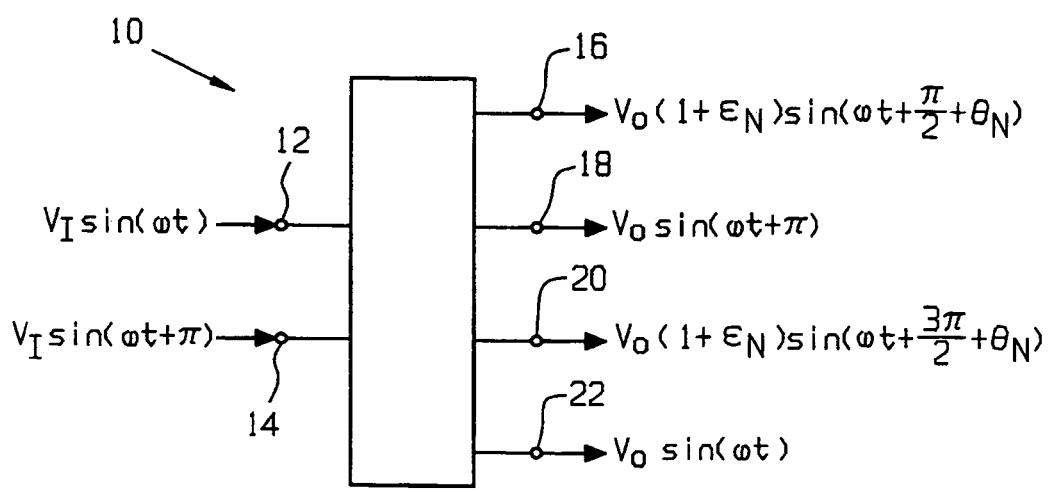
FIG. 4 is a schematic block diagram of the balanced hybrid coupler network of FIG. 3, showing the signal relationships between the various coupler ports, including amplitude and phase errors.

Each of hybrid couplers 28, 30, 32, 34, 60, 62, 64 and 66 have individual characteristics similar to that shown in FIGS. 1A-2 with their corresponding amplitude imbalances and phase errors. However, the amplitude imbalance common to the eight hybrid couplers 28, 30, 32, 34, 60, 62, 64 and 66 used in balanced hybrid coupler network 10 is nearly cancelled. Referring to FIG. 4, the network amplitude imbalance $\varepsilon_N$ of balanced hybrid coupler network 10, is related to the coupler amplitude imbalance $\varepsilon$ common to the eight constituent hybrid couplers and the coupler phase error $\theta$ of the eight constituent hybrid couplers, by the equation:

$$\varepsilon_N = \frac{\sqrt{(1+\varepsilon)^4 + 2\cos(2\theta)(1+\varepsilon)^2 + 1}}{2(1+\varepsilon)} - 1$$

Using typical values of $\varepsilon$=0.01158 (0.1 dB) and $\theta$=1°, the balanced hybrid coupler network's amplitude imbalance N is calculated to be $8.6\times10^{-5}$ (0.00075 dB). The amplitude imbalance has been cancelled in the network by a factor of 135, for example, relative to individual coupler amplitude imbalances $\varepsilon$. In other words, a ratio of any of the coupler amplitude imbalances $\varepsilon$ to the network amplitude imbalance $\varepsilon_N$ is approximately 100, and can be between approximately 20 and 200

The coupler phase error common to the eight hybrid couplers 28, 30, 32, 34, 60, 62, 64 and 66 used in balanced hybrid coupler network 10 is also nearly cancelled. Again referring to FIG. 4, the network phase error $\theta_N$ of balanced hybrid coupler network 10, is related to the coupler phase error $\theta$ common to the eight constituent hybrid couplers, and the coupler amplitude imbalance $\varepsilon$ common to the eight constituent hybrid couplers, by the equation:

$$\theta_N = \arctan\left[\frac{\sin(2\theta)(1+\varepsilon)^2}{\cos(2\theta)(1+\varepsilon)^2 + 1}\right] - \theta$$

Using typical values of $\varepsilon$=0.01158 (0.1 dB) and $\theta$=1°, the balanced hybrid coupler network's phase error $\theta_N$ is calculated to be 0.0115°. The phase error has been cancelled in the network by a factor of 87. In other words, the ratio of any of the coupler phase errors $\theta$ to the network phase error $\theta_N$ is approximately 100, and can be between approximately 20 and 200.

The useable frequency bandwidth of balanced hybrid coupler network 10 is much greater than the useable frequency bandwidth of an individual hybrid coupler. The amplitude imbalance of a typical hybrid coupler can be as great as ±1 dB over a 2:1 frequency bandwidth. Outside this bandwidth, the amplitude imbalance becomes progressively worse. Since balanced hybrid coupler network 10 cancels the amplitude imbalance of the constituent hybrid couplers to a first order approximation, balanced hybrid coupler network 10 can typically be used over a 4:1 frequency bandwidth. Balanced hybrid coupler network 10 can therefore have a ratio of network bandwidth to coupler bandwidth of approximately 2, and can be between approximately 1.5 and 2.5

Balanced hybrid coupler network 10 of the present invention fills the need for a balanced version of the traditional hybrid coupler. The balanced hybrid coupler network has three pairs of electrically balanced ports 12, 14; 16, 20; and 18, 22; and is electrically symmetrical with respect to ground. Balanced hybrid coupler network 10 of the present invention rejects common mode signals present at its ports, due at least in part to the common mode signal being presented to the ports in-phase. This ability to reject common-mode signals makes balanced hybrid coupler network 10 less susceptible to EMI and other unwanted signals than the traditional hybrid coupler.

Balanced hybrid coupler network 10 of the present invention can use improved circuit fabrication techniques which make available component hybrid couplers that have very small unit-to-unit variations in amplitude and phase response although each individual hybrid coupler still has its corresponding amplitude imbalance and phase error. The unit-to-unit variations in amplitude imbalance and phase error are typically much smaller than the values of amplitude imbalance and phase error for a hybrid coupler at a given frequency. Balanced hybrid coupler network 10 can be realized using coaxial, waveguide, microstrip and stripline technologies, and/or some combination thereof, and/or other technologies that are known in the art.

Figure 5:
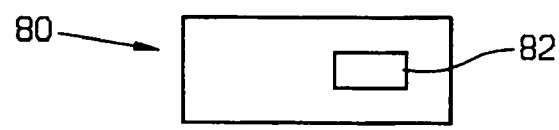
FIG. 5 is a schematic block diagram of an electrical system including a balanced I/Q network according to the present invention.
Figure 6:
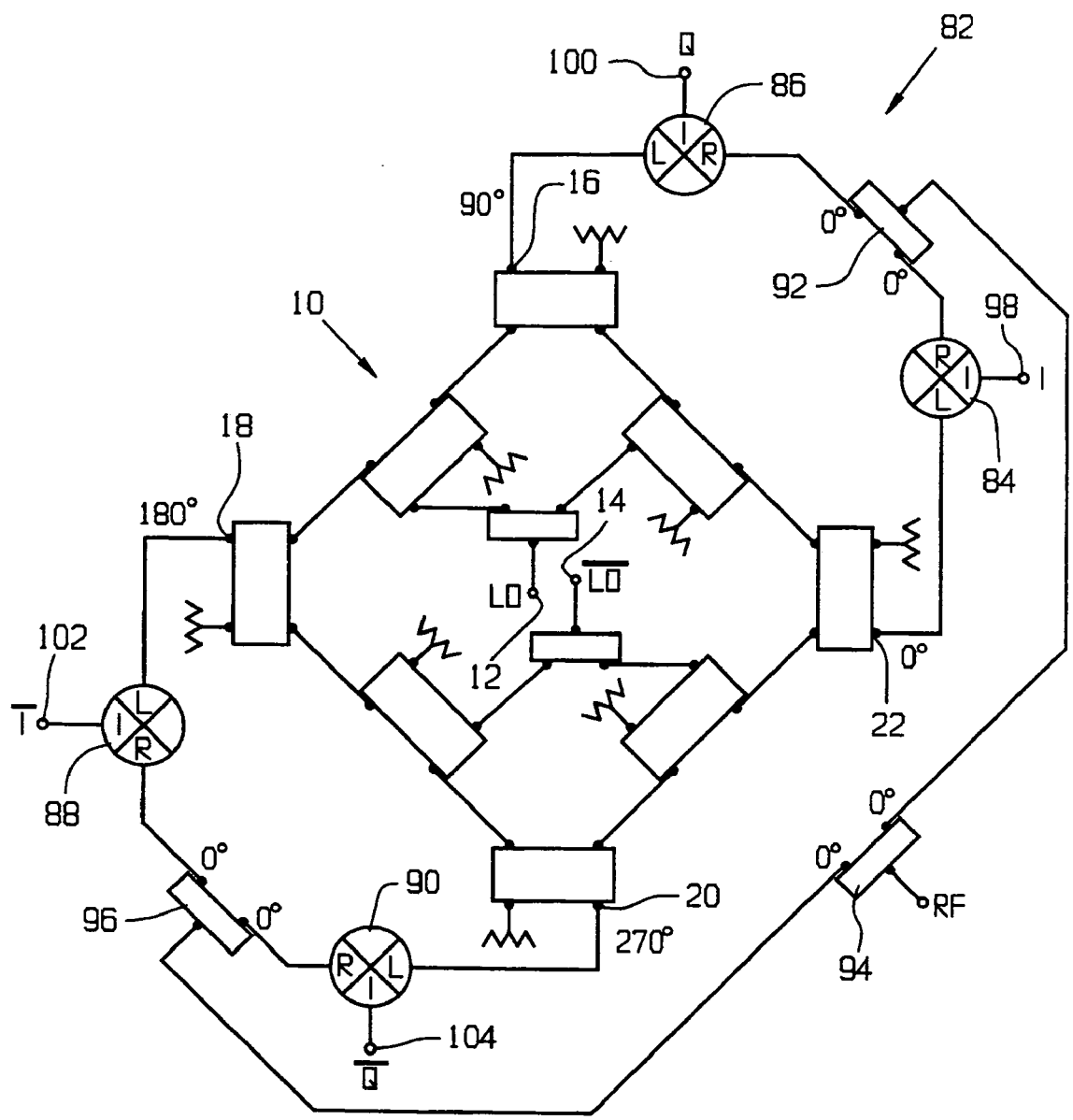
FIG. 6 a schematic view of the balanced I/Q network of FIG. 6.

Electrical system 80 (FIGS. 5 and 6) according to the present invention includes balanced I/Q (in phase/quadrature) network 82 including mixers 84, 86, 88 and 90. Mixers 84, 86, 88 and 90 are typically double balanced mixers. Electrical system 80 further includes an electrical processing network which is shown as balanced hybrid coupler network 10 with ports 12, 14 for signals with a 0°, 180° relative phase, respectively. Ports 22, 16, 18 and 20 of balanced hybrid coupler network 10 are electrically coupled to mixers 84, 86, 88 and 90, respectively, in particular to the local oscillator ports (L on the mixers) of the mixers. In phase power dividers 92, 94 and 96 split the RF signal and provide it to the RF ports (R on the mixers) of mixers 84, 86, 88 and 90. The balanced I/Q network ports 98, 100, 102 and 104 provide intermediate frequency signals with a 0°, 90°, 180° and 270° relative phase, respectively, or in other words, equal-amplitude phase-quadrature signals.

As with balanced hybrid coupler network 10, balanced I/Q network 82 can be used reciprocally with ports 12, 14 acting as inputs, and ports 98, 100, 102 and 104 acting as outputs or ports 12, 14 acting as outputs, and ports 98, 100, 102 and 104 acting as inputs. The reciprocal functionality of I/Q network 82 allows electrical system 80 to be a single sideband upconverter, an image reject mixer, a modulator and/or a demodulator. In general, balanced I/Q network 82 exhibits the advantages inherent with balanced hybrid coupler network 10. Balanced I/Q network 82 has three pairs of electrically balanced ports 12, 14; 98, 102; and 100, 104; and is electrically symmetrical with respect to ground. Balanced I/Q network 82 of the present invention rejects common mode signals present at its ports, due at least in part to the common mode signal being presented to the ports in-phase. This ability to reject common-mode signals makes balanced I/Q network 82 less susceptible to EMI and other unwanted signals. Because of the use of balanced hybrid coupler network 10 in balanced I/Q network 82, balanced I/Q network 82 exhibits minimal amplitude and phase errors and increased bandwidth.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. An electrical processing network, comprising:
    a first set of ports for a first set of signals having approximately 0° and 180° relative phase;
    a second set of ports electrically coupled to said first set of ports, said second set of ports for a second set of signals having approximately 0°, 90°, 180° and 270° relative phase, said first set of ports including a first port for a first signal with a first phase and a second port electrically coupled to said first port, said second port for a second signal with a second phase, said second phase with approximately 180° relative phase to said first phase, said second set of ports including a third port for a third signal having a third phase, a fourth port for a fourth signal having a fourth phase, a fifth port for a fifth signal having a fifth phase, and a sixth port for a sixth signal having a sixth phase, said third phase having approximately 0° relative phase to said first phase, said fourth phase having approximately 90° relative phase to said first phase, said fifth phase having approximately 180° relative phase to said first phase, and said sixth phase having approximately 270° relative phase to said first phase; and
    a first hybrid coupler, a second hybrid coupler, a third hybrid coupler, a fourth hybrid coupler, a fifth hybrid coupler, a sixth hybrid coupler, a seventh hybrid coupler, an eighth hybrid coupler, a first power divider and a second power divider, said first port directly connected to said first power divider, said second port directly connected to said second power divider, said first power divider directly connected to said first hybrid coupler and said second hybrid coupler, said second power divider directly connected to said third hybrid coupler and said fourth hybrid coupler, said third port directly connected to said fifth hybrid coupler, said fourth port directly connected to said sixth hybrid coupler, said fifth port directly connected to said seventh hybrid coupler, said sixth port directly connected to said eighth hybrid coupler, said first hybrid coupler directly connected to both said sixth hybrid coupler and said seventh hybrid coupler, said second hybrid coupler directly connected to both said fifth hybrid coupler and said sixth hybrid coupler, said third hybrid coupler directly connected to both said seventh hybrid coupler and said eighth hybrid coupler, said fourth hybrid coupler directly connected to both said fifth hybrid coupler and said eighth hybrid coupler.

2. The electrical processing network of claim 1, wherein said first set of ports are in a reciprocal relation with said second set of ports.

3. The electrical processing network of claim 1, further including a network amplitude imbalance associated with said second set of ports, at least one of said hybrid couplers including at least one coupler amplitude imbalance, a ratio of any of said at least one coupler amplitude imbalance to said network amplitude imbalance being between approximately 20 and 200.

4. The electrical processing network of claim 1, further including a network phase error associated with said second set of ports, at least one of said hybrid couplers including at least one coupler phase error, a ratio of any of said at least one coupler phase error to said network phase error being between approximately 20 and 200.

5. The electrical processing network of claim 1, further including a network bandwidth, at least of said hybrid couplers including at least one coupler bandwidth, a ratio of said network bandwidth to any of said at least one coupler bandwidth being between approximately 1.5 and 2.5.

6. The electrical processing network of claim 1, further including a network bandwidth of approximately 4:1.

7. A method of electrical processing, comprising the steps of:
    producing both a first signal and a second signal at a first set of ports, said first signal having approximately 0° relative phase, said second signal having approximately 180° relative phase to said first signal;
    generating a second set of signals at a second set of ports, said second set of ports electrically coupled to said first set of ports, said second set of signals having approximately 0°, 90°, 180° and 270° relative phase to said first signal; and
    increasing a ratio of a coupler amplitude imbalance to a network amplitude imbalance to between approximately 20 and 200.

8. The method of claim 7, further including the step of maximizing a ratio of a coupler phase error to a network phase error to between approximately 20 and 200.

9. The method of claim 7, further including the step of increasing a ratio of said network bandwidth to any of said at least one coupler bandwidth to between approximately 1.5 and 2.5.

10. An electrical system, comprising:
    a balanced I/Q network including at least one mixer;
    an electrical processing network electrically coupled to said at least one mixer, said electrical processing network having a first set of ports for a first set of signals having approximately 0° and 180° relative phase and a second set of ports electrically coupled to said first set of ports, said second set of ports for a second set of signals having approximately 0°, 90°, 180° and 270° relative phase; and
    a network amplitude imbalance associated with said second set of ports, at least one hybrid coupler electrically coupled to at least one of said first set of ports and said second set of ports, said at least one hybrid coupler including at least one coupler amplitude imbalance, a ratio of any of said at least one coupler amplitude imbalance to said network amplitude imbalance being between approximately 20 and 200.

11. The electrical system of claim 10, wherein said first set of ports are in a reciprocal relation with said second set of ports.

12. The electrical system of claim 10, wherein the electrical system is one of a single sideband upconverter, an image reject mixer, a modulator and a demodulator.

13. The electrical system of claim 10, further including a network phase error associated with said second set of ports, said at least one hybrid coupler including at least one coupler phase error, a ratio of any of said at least one coupler phase error to said network phase error being between approximately 20 and 200.

14. The electrical system of claim 10, further including a network bandwidth, said at least one hybrid coupler including at least one coupler bandwidth, a ratio of said network bandwidth to any of said at least one coupler bandwidth being between approximately 1.5 and 2.5.

15. The electrical system of claim 10, further including a network bandwidth of approximately 4:1.

16. The electrical system of claim 10, wherein said first set of ports includes a first port for a first signal with a first phase and a second port electrically coupled to said first port, said second port for a second signal with a second phase, said second phase with approximately 180° relative phase to said first phase, said second set of ports including a third port for a third signal having a third phase, a fourth port for a fourth signal having a fourth phase, a fifth port for a fifth signal having a fifth phase, and a sixth port for a sixth signal having a sixth phase, said third phase having approximately 0° relative phase to said first phase, said fourth phase having approximately 90° relative phase to said first phase, said fifth phase having approximately 180° relative phase to said first phase, and said sixth phase having approximately 270° relative phase to said first phase.

17. The electrical system of claim 16, further including a first power divider and a second power divider, said at least one hybrid coupler including a first hybrid coupler, a second hybrid coupler, a third hybrid coupler, a fourth hybrid coupler, a fifth hybrid coupler, a sixth hybrid coupler, a seventh hybrid coupler, an eighth hybrid coupler, said first port directly connected to said first power divider, said second port directly connected to said second power divider, said first power divider directly connected to said first hybrid coupler and said second hybrid coupler, said second power divider directly connected to said third hybrid coupler and said fourth hybrid coupler, said third port directly connected to said fifth hybrid coupler, said fourth port directly connected to said sixth hybrid coupler, said fifth port directly connected to said seventh hybrid coupler, said sixth port directly connected to said eighth hybrid coupler, said first hybrid coupler directly connected to both said sixth hybrid coupler and said seventh hybrid coupler, said second hybrid coupler directly connected to both said fifth hybrid coupler and said sixth hybrid coupler, said third hybrid coupler directly connected to both said seventh hybrid coupler and said eighth hybrid coupler, said fourth hybrid coupler directly connected to both said fifth hybrid coupler and said eighth hybrid coupler.

\* \* \* \* \*